(12) United States Patent
Takebayashi et al.

(10) Patent No.: US 12,473,649 B2
(45) Date of Patent: Nov. 18, 2025

(54) WAFER PLACEMENT TABLE

(71) Applicant: NGK Insulators, Ltd., Nagoya (JP)

(72) Inventors: Hiroshi Takebayashi, Handa (JP); Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 631 days.

(21) Appl. No.: 17/813,051

(22) Filed: Jul. 18, 2022

(65) Prior Publication Data
US 2023/0055928 A1 Feb. 23, 2023

(30) Foreign Application Priority Data
Aug. 17, 2021 (JP) ................. 2021-132887

(51) Int. Cl.
*H01L 21/306* (2006.01)
*C23C 16/458* (2006.01)
*H01J 37/32* (2006.01)
*H01L 21/67* (2006.01)
*H01L 21/687* (2006.01)

(52) U.S. Cl.
CPC .... *C23C 16/4586* (2013.01); *H01J 37/32642* (2013.01); *H01J 37/32715* (2013.01); *H01J 37/32724* (2013.01); *H01L 21/67109* (2013.01); *H01L 21/68785* (2013.01); *H01J 2237/002* (2013.01)

(58) Field of Classification Search
CPC ........... H01J 37/32724; H01J 37/32715; H01J 37/32091; H01L 21/68785
See application file for complete search history.

(56) References Cited

U.S. PATENT DOCUMENTS

| 2017/0092472 A1 | 3/2017 | Koiwa et al. |
| 2017/0103871 A1* | 4/2017 | An .................. G01R 29/02 |
| 2018/0218886 A1* | 8/2018 | Yamaguchi ....... H01L 21/67069 |

(Continued)

FOREIGN PATENT DOCUMENTS

| JP | 2005183645 A * | 7/2005 |
| JP | 2017-063011 A | 3/2017 |

(Continued)

OTHER PUBLICATIONS

Korean Office Action (with English translation) dated May 2, 2024 (Application No. 10-2022-0087522).

*Primary Examiner* — Luz L Alejandro Mulero
(74) *Attorney, Agent, or Firm* — BURR PATENT LAW, PLLC

(57) ABSTRACT

A wafer placement table includes a ceramic base, a first cooling base, and a second cooling base. The ceramic base has a wafer placement surface and incorporates a wafer attracting electrode and a heater electrode. The first cooling base is bonded via a metal bonding layer to a surface of the ceramic base on a side opposite to the wafer placement surface and has a first refrigerant flow channel capable of switching between supply and stop of supply of first refrigerant. The second cooling base is attached via a space layer, capable of supplying heat-transfer gas, to a surface of the first cooling base on a side opposite to the metal bonding layer and has a second refrigerant flow channel capable of switching between supply and stop of supply of second refrigerant.

12 Claims, 5 Drawing Sheets

(56) References Cited

U.S. PATENT DOCUMENTS

2018/0309423 A1* 10/2018 Okunishi ............ C23C 16/4585
2020/0251371 A1*  8/2020 Kuno .................. H01L 21/6831
2020/0388471 A1   12/2020 Takabayashi

FOREIGN PATENT DOCUMENTS

| KR | 10-2018-0090204 A | 8/2018 |
| TW | 202025370 A | 7/2020 |

* cited by examiner

WAFER PLACEMENT TABLE

BACKGROUND OF THE INVENTION

1. Field of the Invention

The present invention relates to a wafer placement table.

2. Description of the Related Art

A wafer placement table is used to perform CVD, etching, or the like on a wafer by using plasma. A wafer placement table described in, for example, Patent Literature 1 includes a metal cooling block in which a flow channel for refrigerant is formed, a radio-frequency transmission power supply body connected to the bottom surface of the cooling block, an electrically conductive base provided on the top surface of the cooling block, and an electrostatic chuck metal-bonded to the base. The electrostatic chuck incorporates an attracting electrode and a heater. The cooling block and the base are clamped by a metal fastening member via an O-ring. The fastening member ensures electrical conduction between the cooling block and the base. Heat-transfer gas is supplied to the space defined by the cooling block, the base, and the O-ring.

CITATION LIST

Patent Literature

PTL 1: JP 2017-63011 A

SUMMARY OF THE INVENTION

However, such a wafer placement table is suitable for processing a wafer at a high temperature, but there has been a problem that such a wafer placement table is not suitable for efficiently dissipating heat from the wafer after that.

The present invention is made to solve such a problem, and it is a main object to achieve both processing a wafer at a high temperature and efficiently dissipating heat from the wafer.

A wafer placement table of the present invention includes a ceramic base having a wafer placement surface and incorporating an electrostatic electrode and a heater electrode; a first cooling base bonded via a metal bonding layer to a surface of the ceramic base on a side opposite to the wafer placement surface, having a first refrigerant flow channel capable of switching between supply and stop of supply of first refrigerant; and a second cooling base attached via a space layer, capable of supplying heat-transfer gas, to a surface of the first cooling base on a side opposite to the metal bonding layer, having a second refrigerant flow channel capable of switching between supply and stop of supply of second refrigerant.

With this wafer placement table, it is possible to achieve both processing a wafer at a high temperature and efficiently dissipating heat from the wafer. For example, in a process that requires an increase in the temperature of a wafer, it is applicable that the first refrigerant is not flowed through the first refrigerant flow channel of the first cooling base and the second refrigerant is flowed through the second refrigerant flow channel of the second cooling base. With this configuration, heat of the wafer heated by energizing the heater electrode is not so drawn by the first cooling base close to the ceramic base and is drawn by the second cooling base far from the ceramic base. Therefore, it is possible to process the wafer while maintaining the wafer at a high temperature. For example, in a process that requires high heat dissipation of a wafer, the first refrigerant may be flowed through the first refrigerant flow channel of the first cooling base. With this configuration, heat of the wafer heated by energizing the heater electrode is drawn by the first cooling base close to the ceramic base, so it is possible to efficiently dissipate heat from the wafer. Heat-transfer gas is supplied to the space layer when good thermal conduction between the first cooling base and the second cooling base needs to be obtained.

In the wafer placement table of the present invention, the space layer may be capable of switching between a vacuum state and a heat-transfer gas filling state. When the space layer is set to the vacuum state, it is possible to insulate heat between the first cooling base and the second cooling base. When the space layer is filled with heat-transfer gas, it is possible to obtain good thermal conduction between the first cooling base and the second cooling base.

In the wafer placement table of the present invention, a temperature of the first refrigerant may be lower than a temperature of the second refrigerant. For example, in a process that requires high heat dissipation of a wafer, heat is more easily drawn by providing the first cooling base, so it is possible to further efficiently dissipate heat from the wafer.

In the wafer placement table of the present invention, the first refrigerant flow channel may be capable of switching between circulation and stop of circulation of the first refrigerant, and the second refrigerant flow channel may be capable of switching between circulation and stop of circulation of the second refrigerant. For example, in a process that requires high heat dissipation of a wafer, the first refrigerant may be circulated through the first refrigerant flow channel, and, in a process of processing a wafer at a high temperature, the second refrigerant may be circulated through the second refrigerant flow channel while stopping circulation of the first refrigerant through the first refrigerant flow channel.

In the wafer placement table of the present invention, at least one of the first or second cooling bases may also serve as a plasma generating electrode. With this configuration, it is possible to simplify the structure as compared to a case where a plasma generating electrode is embedded in the ceramic base.

In the wafer placement table of the present invention, a difference in coefficient of thermal expansion between the ceramic base and the first cooling base may be lower than or equal to $1 \times 10^{-6}$/K. With this configuration, even when the wafer placement table is repeatedly used between high temperature and low temperature, it is possible to reduce interference with bonding of the ceramic base with the first cooling base. For example, when the ceramic base is made of alumina, the first cooling base is preferably made of SiSiCTi or AlSiC.

In the wafer placement table of the present invention, a thickness of the space layer is preferably greater than or equal to 0.05 mm and less than or equal to 2 mm. When the thickness of the space layer is greater than or equal to a lower limit value, it is possible to control variations in the thickness of the space layer in a plane, so it is preferable in terms of reducing the influence of thermal resistance variations. When the thickness of the space layer is less than or equal to an upper limit value, it is preferable in terms of not large thermal resistance from the viewpoint of the response of temperature control.

In the wafer placement table of the present invention, the space layer may be defined by a seal ring disposed between the first cooling base and the second cooling base. In this case, the seal ring may be a metal ring or may be a resin ring or may be a combination of a metal ring and a resin ring. When a combination of a metal ring and a resin ring is used, it is possible to restrict the amount of deformation of the resin ring with the metal ring. The seal ring may be provided along an outer periphery of one of the first cooling base and the second cooling base, having a smaller diameter. A spacer that restricts a thickness of the space layer may be provided in the space layer. With this configuration, it is easy to maintain the overall thickness of the space layer.

In the wafer placement table of the present invention, the first refrigerant flow channel may be less in cross-sectional area and longer in flow channel length than the second refrigerant flow channel. With this configuration, good heat dissipation is obtained by the first refrigerant flow channel.

DETAILED DESCRIPTION OF THE INVENTION

Figure 1:
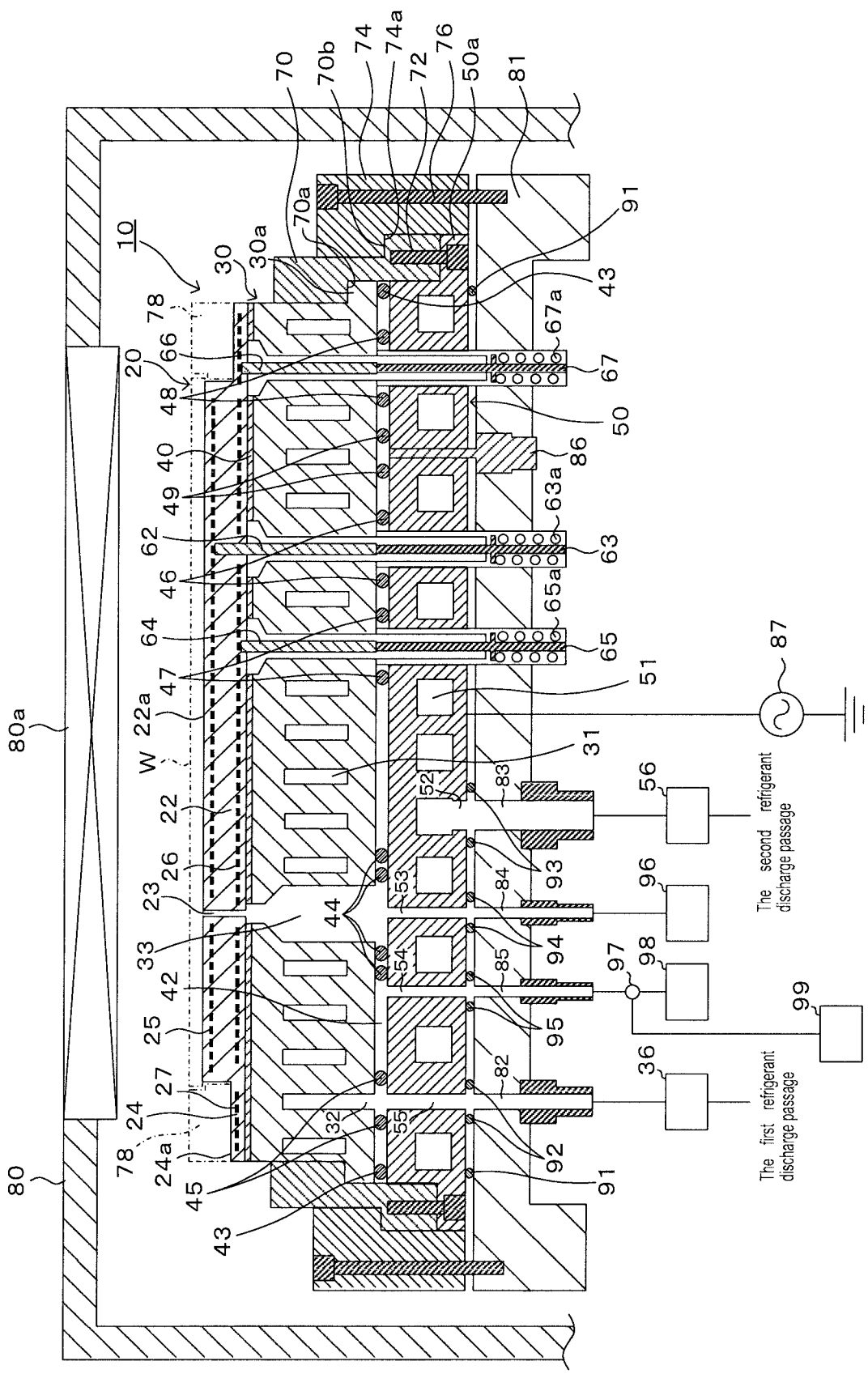
FIG. 1 is a longitudinal sectional view of a wafer placement table 10.
Figure 2:
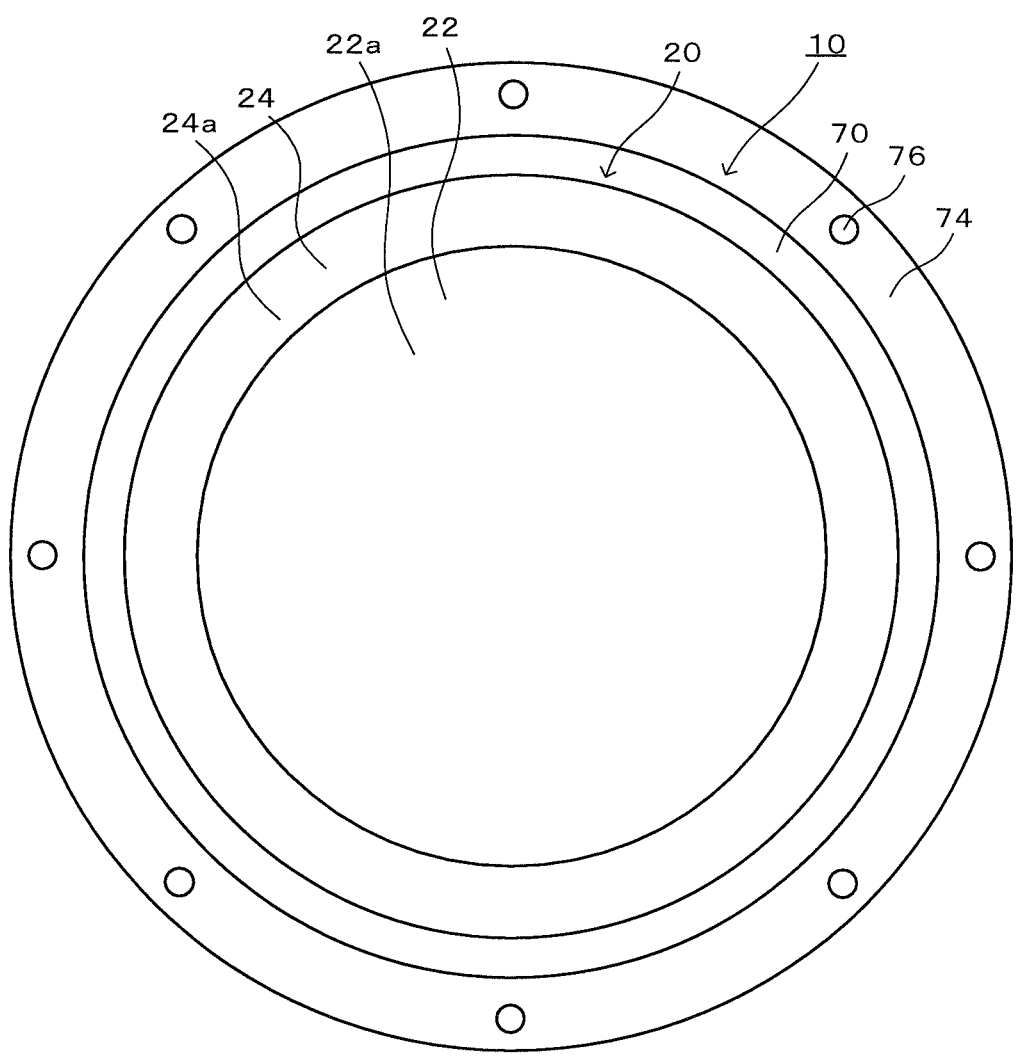
FIG. 2 is a plan view of the wafer placement table 10.

A preferred embodiment of the present invention will be described below with reference to the drawings. FIG. 1 is a longitudinal sectional view of a wafer placement table 10 (a sectional view taken along a plane including the central axis of the wafer placement table 10). FIG. 2 is a plan view of the wafer placement table 10. In the following description, up and down, right and left, front and rear, and the like can be used for illustration; however, up and down, right and left, and front and rear are only relative positional relationships. In the specification, "X to Y" indicating a numeric range is used as a meaning of including numeric values X and Y as a lower limit value and an upper limit value.

The wafer placement table 10 is used to perform CVD, etching, or the like on a wafer W by using plasma and is fixed to a mounting plate 81 provided inside a semiconductor process chamber 80. The wafer placement table 10 includes a ceramic base 20, a first cooling base 30, a metal bonding layer 40, a space layer 42, a second cooling base 50, and a clamp member 70.

The ceramic base 20 includes an outer peripheral part 24 having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a.

The central part 22 of the ceramic base 20 incorporates a wafer attracting electrode 25 and a heater electrode 26 in order from the side close to the wafer placement surface 22a. These electrodes 25, 26 are made of a material that contains, for example, W, Mo, WC, MoC, or the like. The wafer attracting electrode 25 is a disc-shaped or mesh-shaped single-pole electrostatic electrode. A layer of the ceramic base 20 on the upper side of the wafer attracting electrode 25 functions as a dielectric layer. A wafer adsorption direct current power supply (not shown) is connected to the wafer attracting electrode 25 via a power supply terminal 62 and a power supply rod 63. The top surface of the power supply terminal 62 is bonded to the bottom surface of the wafer attracting electrode 25, and the bottom surface of the power supply terminal 62 is in contact with the top surface of the power supply rod 63 urged upward by a spring 63a. The power supply terminal 62 and the power supply rod 63 are inserted in an electrically insulated state in holes respectively provided in the heater electrode 26, the first cooling base 30, the metal bonding layer 40, the second cooling base 50, and the mounting plate 81 and extended through in an up and down direction. The heater electrode 26 is wired in a one-stroke pattern from one end to the other end so as to extend over the entire surface of the wafer placement surface 22a in plan view. A heater power supply (not shown) is connected to one end of the heater electrode 26 via a power supply terminal 64 and a power supply rod 65. The top surface of the power supply terminal 64 is bonded to the bottom surface of one end of the heater electrode 26, and the bottom surface of the power supply terminal 64 is in contact with the top surface of the power supply rod 65 urged upward by a spring 65a. A power supply terminal 66 and a power supply rod 67 are inserted in an electrically insulated state in holes extended through in the up and down direction and respectively provided in the first cooling base 30, the metal bonding layer 40, the second cooling base 50, and the mounting plate 81. Although not shown in the drawing, the other end of the heater electrode 26 is also connected to the heater power supply via a power supply terminal and a power supply rod as in the case of one end of the heater electrode 26. The central part 22 of the ceramic base 20 has a BS gas passage 23 for supplying back side gas (BS gas) to the back side of the wafer W. The BS gas passage 23 extends through the central part 22 of the ceramic base 20 in the up and down direction.

The outer peripheral part 24 of the ceramic base 20 incorporates an FR attracting electrode 27. The FR attracting electrode 27 is made of a material that contains, for example, W, Mo, WC, MoC, or the like. The FR attracting electrode 27 is a disc-shaped or mesh-shaped single-pole electrostatic electrode. A layer of the ceramic base 20 on the upper side of the FR attracting electrode 27 functions as a dielectric layer. An FR adsorption direct current power supply (not shown) is connected to the FR attracting electrode 27 via the power supply terminal 66 and the power supply rod 67. The top surface of the power supply terminal 66 is bonded to the bottom surface of the FR attracting electrode 27, and the bottom surface of the power supply terminal 66 is in contact with the top surface of the power supply rod 67 urged upward by a spring 67a. The power supply terminal 66 and the power supply rod 67 are inserted in an electrically insulated state in holes extended through in the up and down direction and respectively provided in the first cooling base 30, the metal bonding layer 40, the second cooling base 50, and the mounting plate 81.

The first cooling base 30 is an electrically conductive disc-shaped member containing metal and has a first flange 30a on the lower side. The first cooling base 30 has a first refrigerant flow channel 31 in which first refrigerant is able to circulate. The first refrigerant flow channel 31 is formed in a one-stroke pattern from one end to the other end so as to extend over the entire surface of the ceramic base 20 in plan view. One end of the first refrigerant flow channel 31 communicates with a first refrigerant supply passage 32. The other end of the first refrigerant flow channel 31 communicates with a first refrigerant discharge passage. The first cooling base 30 has a BS gas communication passage 33 that communicates with the BS gas passage 23 of the ceramic base 20. The BS gas communication passage 33 extends through the first cooling base 30 in the up and down direction. The BS gas communication passage 33 is formed by a series of a small-diameter hole, a tapered hole, and a large-diameter hole from the top of the first cooling base 30. The small-diameter hole is greater in diameter than the BS gas passage 23. The first cooling base 30 is made of an electrically conductive material containing metal. Examples of the electrically conductive material include a composite material and a metal. Examples of the composite material include a metal composite material (also called metal matrix composite (MMC)). Examples of the MMC include a material including Si, SiC, and Ti, and a material that impregnates an SiC porous body with Al and/or Si. The material including Si, SiC, and Ti is referred to as SiSiCTi, the material that impregnates an SiC porous body with Al is referred to as AlSiC, and the material that impregnates an SiC porous body with Si is referred to as SiSiC. Examples of the metal include Mo.

The metal bonding layer 40 bonds the bottom surface of the ceramic base 20 with the top surface of the first cooling base 30. The metal bonding layer 40 may be, for example, a layer made of solder or a brazing metal material. The metal bonding layer is formed by, for example, TCB (thermal compression bonding). TCB is a known method of sandwiching a metal bonding material between two members to be bonded and bonding the two members in a state heated to a temperature lower than or equal to a solidus temperature of the metal bonding material.

The space layer 42 is provided between the first cooling base 30 and the second cooling base 50. The space layer 42 is defined by the bottom surface of the first cooling base 30, the top surface of the second cooling base 50, and a large-diameter seal ring 43. The thickness of the space layer 42 is preferably greater than or equal to 0.05 mm and less than or equal to 2 mm. The large-diameter seal ring 43 is a ring that defines the space layer 42 and that has an outside diameter slightly less than the diameter of the bottom surface of the first cooling base 30. The seal ring 43 may be a metal ring or may be a resin ring (electrically insulating ring) or may be a combination of a metal ring and a resin ring. When a combination of a metal ring and a resin ring is used, it is possible to restrict the amount of deformation of the resin ring with the metal ring. A spacer that restricts the thickness of the space layer 42 may be provided in the space layer 42. The spacer may be made of metal or may be made of resin.

The second cooling base 50 is attached to the first cooling base 30 via the space layer 42. The second cooling base 50 is an electrically conductive disc-shaped member containing metal and has a second flange 50a on the lower side. The second cooling base 50 has a second refrigerant flow channel 51 in which second refrigerant is able to circulate. The second refrigerant flow channel 51 is formed in a one-stroke pattern from one end to the other end so as to extend over the entire surface of the ceramic base 20 in plan view. One end of the second refrigerant flow channel 51 communicates with a second refrigerant supply passage 52. The other end of the second refrigerant flow channel 51 communicates with a second refrigerant discharge passage. The second cooling base 50 has a BS gas communication passage 53 that communicates with the BS gas communication passage 33 of the first cooling base 30. The BS gas communication passage 53 is a cylindrical hole that extends through the second cooling base 50 in the up and down direction. The BS gas communication passage 33 and the BS gas communication passage 53 are coupled in an airtight manner by small-diameter seal rings 44 disposed between the first cooling base 30 and the second cooling base 50. Therefore, the BS gas communication passage 33 and the BS gas communication passage 53 do not communicate with the space layer 42. The double small-diameter seal rings 44 are provided as shown in FIG. 1 in the present embodiment; however, a single small-diameter seal ring 44 may be provided.

The second cooling base 50 has a heat-transfer gas supply/discharge passage 54 that communicates with the space layer 42. The heat-transfer gas supply/discharge passage 54 is a cylindrical hole that extends through the second cooling base 50 in the up and down direction. The heat-transfer gas supply/discharge passage 54 is used to fill the space layer 42 with heat-transfer gas (for example, helium gas) or evacuate the space layer. The second cooling base 50 has a first refrigerant communication passage 55 that communicates with the first refrigerant supply passage 32 of the first cooling base 30. The first refrigerant communication passage 55 is a cylindrical hole that extends through the second cooling base 50 in the up and down direction. The first refrigerant supply passage 32 and the first refrigerant communication passage 55 are coupled in a fluidtight manner by a small-diameter refrigerant seal ring 45 disposed between the first cooling base 30 and the second cooling base 50. Therefore, the first refrigerant supply passage 32 and the first refrigerant communication passage 55 do not communicate with the space layer 42. The second cooling base 50 is connected to a radio-frequency power supply 87 for generating plasma and is used as a radio-frequency electrode. The second cooling base 50 is made of an electrically conductive material containing metal. Examples of the electrically conductive material include a composite material and a metal. The electrically conductive material is preferably Al, Ti, or the like.

The clamp member 70 is an annular metal member with a substantially Z-shaped cross section and has an inner peripheral step surface 70a and an outer peripheral step surface 70b. The first cooling base 30 and the second cooling base 50 are united by the clamp member 70. In other words, various seal rings 43 to 49 are disposed between the first cooling base 30 and the second cooling base 50, the inner peripheral step surface 70a of the clamp member 70 is disposed on the first flange 30a of the first cooling base 30, and the bottom surface of the clamp member 70 is disposed on the second flange 50a of the second cooling base 50. Bolts 72 are inserted from the bottom surface of the second flange 50a and are screwed to threaded holes provided at the bottom surface of the clamp member 70. The bolts 72 are placed at multiple locations (for example, eight locations or 12 locations) provided at equal intervals along the circumferential direction of the second flange 50a. The power supply rod 63 is inserted in the seal ring 46, the power supply rod 65 is inserted in the seal ring 47, and the power supply rod 67 is inserted in the seal ring 48. The inner spaces of the seal rings 46 to 48 do not communicate with the space layer 42. The seal rings 44 to 48 each may be a metal ring or may be a resin ring or may be a combination of a metal ring and a resin ring. The seal rings 44 to 48 may play a role as a spacer that restricts the thickness of the space layer 42. The first cooling base 30 and the second cooling base 50 are united by the electrically conductive clamp member 70, so the first cooling base 30 and the second cooling base 50 have the same potential. Since the second cooling base 50 functions as a radio-frequency electrode, the first cooling base 30 also functions as a radio-frequency electrode.

The thus configured wafer placement table 10 is attached to the mounting plate 81 inside the chamber 80 by using a mounting member 74. The mounting plate 81 has a first refrigerant introduction passage 82, a second refrigerant introduction passage 83, a BS gas introduction passage 84, and a heat-transfer gas inlet/outlet passage 85. The first refrigerant introduction passage 82 is provided so as to extend through the mounting plate 81 in the up and down direction at a location facing the first refrigerant communication passage 55 and communicates in a fluidtight manner with the first refrigerant communication passage 55 by a seal ring 92 between the second cooling base 50 and the mounting plate 81. The second refrigerant introduction passage 83 is provided so as to extend through the mounting plate 81 in the up and down direction at a location facing the second refrigerant supply passage 52 and communicates in a fluidtight manner with the second refrigerant supply passage 52 by a seal ring 93 between the second cooling base 50 and the mounting plate 81. The BS gas introduction passage 84 is provided so as to extend through the mounting plate 81 in the up and down direction at a location facing the BS gas communication passage 53 and communicates in an airtight manner with the BS gas communication passage 53 by a seal ring 94 between the second cooling base 50 and the mounting plate 81. The heat-transfer gas inlet/outlet passage 85 is provided so as to extend through the mounting plate 81 in the up and down direction at a location facing the heat-transfer gas supply/discharge passage 54 and communicates with the heat-transfer gas supply/discharge passage 54 in an airtight manner by a seal ring 95 between the second cooling base 50 and the mounting plate 81. The mounting plate 81 includes through-holes that respectively allow insertion of the power supply rods 63, 65, 67, and a temperature sensor 86 that measures the temperature of the first cooling base 30. The distal end (temperature detecting part) of the temperature sensor 86 is exposed to a temperature detecting space surrounded by the first cooling base 30, the second cooling base 50, and the seal ring 49. The temperature detecting space is a space that does not communicate with the space layer 42 and actually has the same temperature as the temperature of the first cooling base 30. A seal ring 91 having substantially the same size as the large-diameter seal ring 43 is disposed along the outer periphery of the second cooling base 50 between the second cooling base 50 and the mounting plate 81.

A first refrigerant circulator 36 is attached to the first refrigerant introduction passage 82. The first refrigerant circulator 36 is a circulation pump that has a temperature adjustment function. The first refrigerant circulator 36 introduces first refrigerant adjusted to a desired temperature into the first refrigerant introduction passage 82, adjusts the first refrigerant discharged from the first refrigerant discharge passage of the first refrigerant flow channel 31 to a desired temperature, and then introduces the first refrigerant again into the first refrigerant introduction passage 82. A second refrigerant circulator 56 is attached to the second refrigerant introduction passage 83. The second refrigerant circulator 56 is a circulation pump that has a temperature adjustment function. The second refrigerant circulator 56 introduces second refrigerant adjusted to a desired temperature into the second refrigerant introduction passage 83, adjusts the second refrigerant discharged from the second refrigerant discharge passage of the second refrigerant flow channel 51 to a desired temperature, and then introduces the second refrigerant again into the second refrigerant introduction passage 83. A BS gas supply source 96 is attached to the BS gas introduction passage 84. The BS gas supply source 96 supplies heat-transfer gas to the back side of the wafer W via the BS gas introduction passage 84, the BS gas communication passage 53, the BS gas communication passage 33, and the BS gas passage 23. A heat-transfer gas supply source 98 and a vacuum pump 99 are connected to the heat-transfer gas inlet/outlet passage 85 via a selector valve 97. The heat-transfer gas supply source 98 supplies heat-transfer gas to the space layer 42 via the heat-transfer gas inlet/outlet passage 85. The vacuum pump 99 evacuates (decompresses) the inside of the space layer 42 via the heat-transfer gas inlet/outlet passage 85.

The mounting member 74 is an annular member with a substantially inverted L-shaped cross section and has an inner peripheral step surface 74a. The wafer placement table 10 and the mounting plate 81 are united by the mounting member 74. In a state where the inner peripheral step surface 74a of the mounting member 74 is placed on the outer peripheral step surface 70b of the clamp member 70 of the wafer placement table 10, bolts 76 are inserted from the top surface of the mounting member 74 and screwed to threaded holes provided on the top surface of the mounting plate 81. The bolts 76 are mounted at multiple locations (for example, eight locations or 12 locations) provided at equal intervals along the circumferential direction of the mounting member 74. The mounting member 74 and the bolts 76 may be made of an electrically insulating material or may be made of an electrically conductive material (metal or the like).

Next, an example of manufacturing of the wafer placement table 10 will be described with reference to FIGS. 3A to 3F and FIGS. 4A and 4B. FIGS. 3A to 3F and FIGS. 4A and 4B are a manufacturing process chart of the wafer placement table 10. Initially, disc-shaped first to third ceramic molds 111 to 113 are made by mold casting, and electrode patterns 114, 115 are respectively formed by printing electrode paste on the top surfaces of the second and third ceramic molds 112, 113 (see FIG. 3A). Mold casting is a known method of injecting ceramic slurry containing ceramic raw material powder and a molding agent into a die and molding the ceramic slurry by causing the chemical reaction of the molding agent in the die. Examples of the molding agent include isocyanate and polyol. The molding agent may be the one molded by urethane reaction. The electrode paste is, for example, slurry obtained by adding ceramic powder to an electrically conductive material, such as W, Mo, WC, and MoC. The electrode pattern 114 printed on the top surface of the second ceramic mold 112 has the same shape as the wafer attracting electrode 25, and the electrode pattern 115 printed on the top surface of the third ceramic mold 113 has a shape corresponding to a combination of the heater electrode 26 and the FR attracting electrode 27.

Figure 3A:
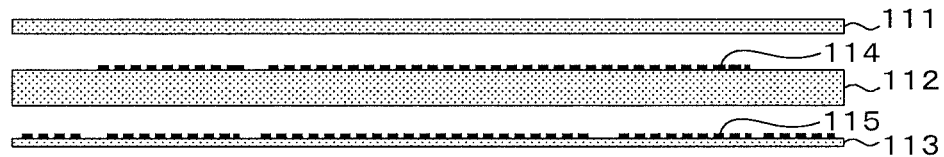
FIGS. 3A to 3F are a manufacturing process chart of the wafer placement table 10.
Figure 3B:

Subsequently, the first ceramic mold 111, the second ceramic mold 112 on the top surface of which the electrode pattern 114 is printed, and the third ceramic mold 113 on the top surface of which the electrode pattern 115 is printed are laminated, and the obtained layered body is fired by hot pressing, with the result that a ceramic sintered body 120 is obtained (see FIG. 3B). Thus, the electrode pattern 114 becomes the wafer attracting electrode 25, and the electrode pattern 115 becomes the heater electrode 26 and the FR attracting electrode 27.

Figure 3C:
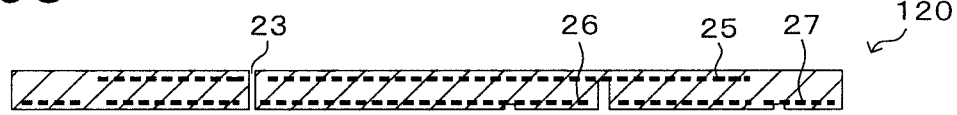

Subsequently, shape and thickness are adjusted by grinding, blasting, or the like on both surfaces of the obtained ceramic sintered body 120, and holes in the up and down direction (holes for inserting the power supply terminals 62, 64, 66, the BS gas passage 23, and the like) are formed (see FIG. 3C).

Figure 3D:
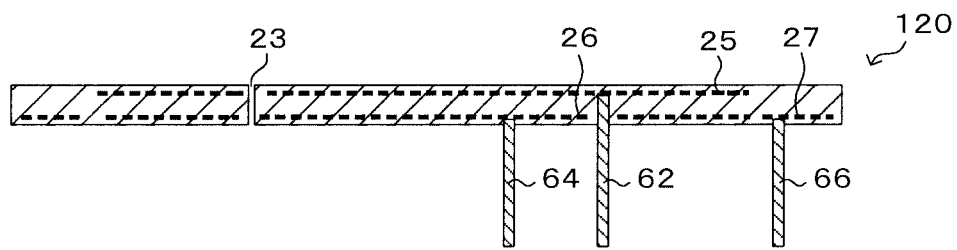
Figure 3E:
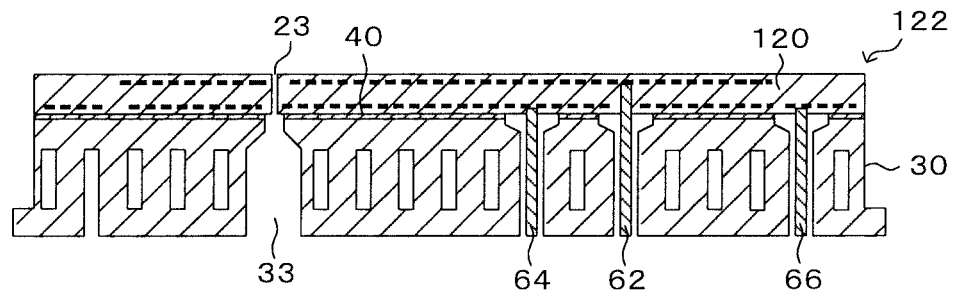

Subsequently, the power supply terminal 62 is inserted into the hole of the ceramic sintered body 120, leading to the wafer attracting electrode 25, and bonded to the wafer attracting electrode 25, the power supply terminal 64 is inserted into the hole leading to the heater electrode 26 and bonded to the heater electrode 26, and the power supply terminal 66 is inserted into the hole leading to the FR attracting electrode 27 and bonded to the FR attracting electrode 27 (FIG. 3D). After that, the first cooling base 30 is prepared, and the ceramic sintered body 120 and the first cooling base 30 are bonded by the metal bonding layer 40 to obtain a bonded body 122 (FIG. 3E). Holes that extend through in the up and down direction at locations respectively facing the power supply terminals 62, 64, 66 of the ceramic sintered body 120 are provided in the first cooling base 30 in advance, and, at the time of bonding, the power supply terminals 62, 64, 66 are inserted into the holes (electrically insulating films have been already formed on inner walls). In addition, at the time of bonding, the BS gas communication passage 33 of the first cooling base 30 is matched with the BS gas passage 23 of the ceramic base 20. When the ceramic sintered body 120 is made of alumina, the first cooling base 30 is preferably made of SiSiCTi. The coefficient of linear thermal expansion in the range of 40° C. to 570° C. is $7.7 \times 10^{-6}$/K for alumina and $7.8 \times 10^{-6}$/K for SiSiCTi.

An SiSiCTi plate, for example, contains one or more raw materials selected so as to contain 39 to 51 percent by mass of silicon carbide raw material particles with an average particle diameter of greater than or equal to 10 µm and less than or equal to 25 µm and contain Ti and Si, and a powder mixture with a mass ratio Si/(Si+Ti) of 0.26 to 0.54 for Si and Ti from the raw materials excluding silicon carbide is made. For example, silicon carbide, metal Si, and metal Ti may be used as raw materials. In this case, mixing is preferably performed such that silicon carbide is 39 to 51 percent by mass, metal Si is 16 to 24 percent by mass, and metal Ti is 26 to 43 percent by mass. After that, a disc-shaped mold is made by uniaxial pressing of the obtained powder mixture, and the mold is sintered in the range of 1370° C. to 1460° C. by hot pressing in an inert atmosphere, with the result that the SiSiCTi plate is obtained.

Bonding between the ceramic sintered body 120 and the first cooling base 30 is performed by using a metal bonding material. For example, a metal bonding material is held between the alumina ceramic sintered body 120 and the SiSiCTi first cooling base 30 to perform TCB bonding. Specifically, a layered body of the ceramic sintered body 120 and the first cooling base 30 is pressurized at a temperature lower than or equal to a solidus temperature of the metal bonding material (for example, higher than or equal to a temperature obtained by subtracting 20° C. from the solidus temperature and lower than or equal to the solidus temperature) to perform TCB bonding, after that the temperature is returned to a room temperature. Thus, the metal bonding material becomes the metal bonding layer 40. An Al—Mg bonding material or an Al—Si—Mg bonding material may be used as the metal bonding material at this time. When, for example, TCB bonding is performed by using an Al—Si—Mg bonding material (88.5 percent by weight of Al, 10 percent by weight of Si, 1.5 percent by weight of Mg, and a solidus temperature of about 560° C.), the ceramic sintered body 120 is pressurized at a pressure of 0.5 to 2.0 kg/mm² for several hours in a state of being heated to 540° C. to 560° C. under vacuum atmosphere. The metal bonding material with a thickness of about 100 µm is preferable.

Figure 3F:
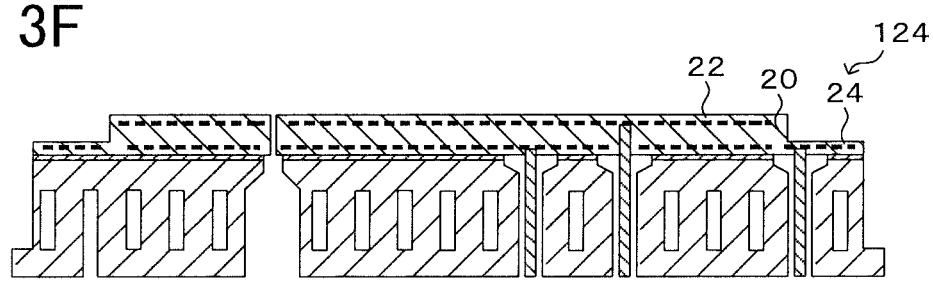
Figure 4A:
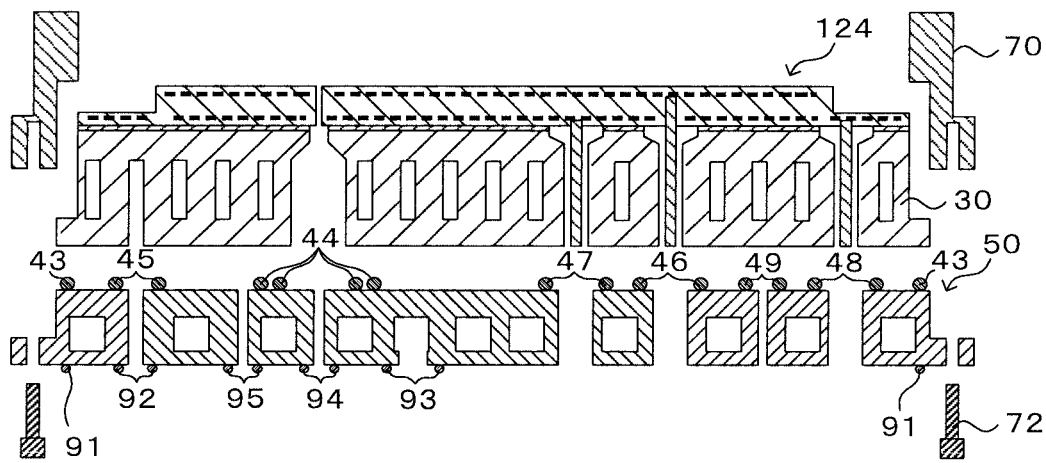
FIGS. 4A and 4B are a manufacturing process chart of the wafer placement table 10.
Figure 4B:
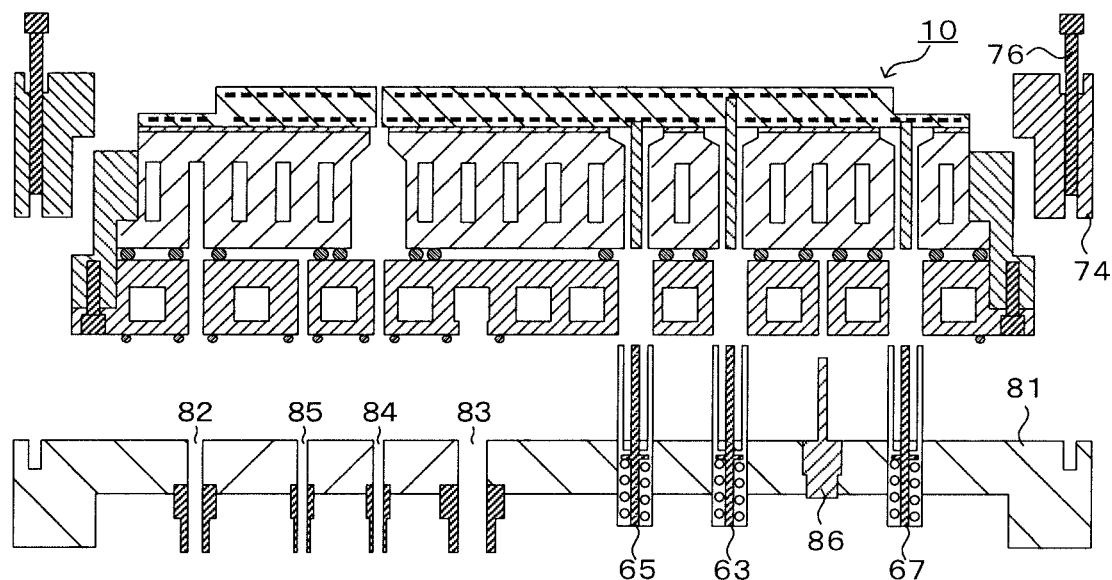

Subsequently, the ceramic base 20 with the central part 22 and the outer peripheral part 24 is obtained by grinding the outer periphery of the ceramic sintered body 120 of the bonded body 122 to form steps, and a bonded body 124 is obtained (FIG. 3F). Subsequently, the second cooling base 50 is prepared, the seal rings 43 to 49 are temporarily attached to the top surface of the second cooling base 50, the seal rings 91 to 95 are temporarily attached to the bottom surface, and the second cooling base 50 and the first cooling base 30 of the bonded body 124 are fastened by the bolts 72 by using the clamp member 70 (FIG. 4A). Thus, the wafer placement table 10 is obtained. The seal rings 43 to 49, 91 to 95 each may be, for example, a fluororesin or silicone resin O-ring. Subsequently, the mounting plate 81 that has the first refrigerant introduction passage 82, the second refrigerant introduction passage 83, the BS gas introduction passage 84, and the heat-transfer gas inlet/outlet passage 85 and to which the temperature sensor 86 and the power supply rods 63, 65, 67 are assembled is prepared. Then, the wafer placement table 10 is placed on the mounting plate 81 and is fastened with the bolts 76 by using the mounting member 74 (see FIG. 4B). In this way, the wafer placement table 10 is fixed to the mounting plate 81.

Surfaces of the metal bonding layer 40, the first cooling base 30, and the clamp member 70, exposed to the outside, are preferably coated with an electrically insulating film. The electrically insulating film can be formed by, for example, thermal spraying using ceramic powder. In addition, surfaces forming paths leading to the BS gas passage 23 (the through-holes of the metal bonding layer 40, the BS gas communication passages 33, 53, the BS gas introduction passage 84, and the like) are also preferably coated with an electrically insulating film.

Next, an example of the use of the wafer placement table 10 will be described with reference to FIG. 1. The wafer placement table 10 is mounted on the mounting plate 81 of the chamber 80 as described above. A shower head 80a that discharges process gas from a large number of gas injection holes into the chamber 80 is disposed on the ceiling surface of the chamber 80.

A focus ring 78 is placed on the FR placement surface 24a of the wafer placement table 10, and a disc-shaped wafer W is placed on the wafer placement surface 22a. The focus ring 78 has a step along the inner periphery of an upper end part so as not to interfere with the wafer W. In this state, the wafer W is adsorbed to the wafer placement surface 22a by applying a direct current voltage to the wafer attracting electrode 25, and the focus ring 78 is adsorbed to the FR placement surface 24a by applying a direct current voltage to the FR attracting electrode 27. BS gas (for example, helium gas) is supplied from the BS gas passage 23 to the back side of the wafer W, and the wafer W is controlled to a high temperature (for example, 400° C.) by energizing the heater electrode 26. Then, the inside of the chamber 80 is set to a predetermined vacuum atmosphere (or decompression atmosphere), and a radio-frequency voltage from the radio-frequency power supply 87 is applied to the second cooling base 50 while process gas is being supplied from the shower head 80a. As a result, plasma is generated between the first cooling base 30 (which has the same potential as the second cooling base 50) and the shower head 80*a*. Then, the high-temperature wafer W is subjected to a process by using the plasma.

Figure 5:
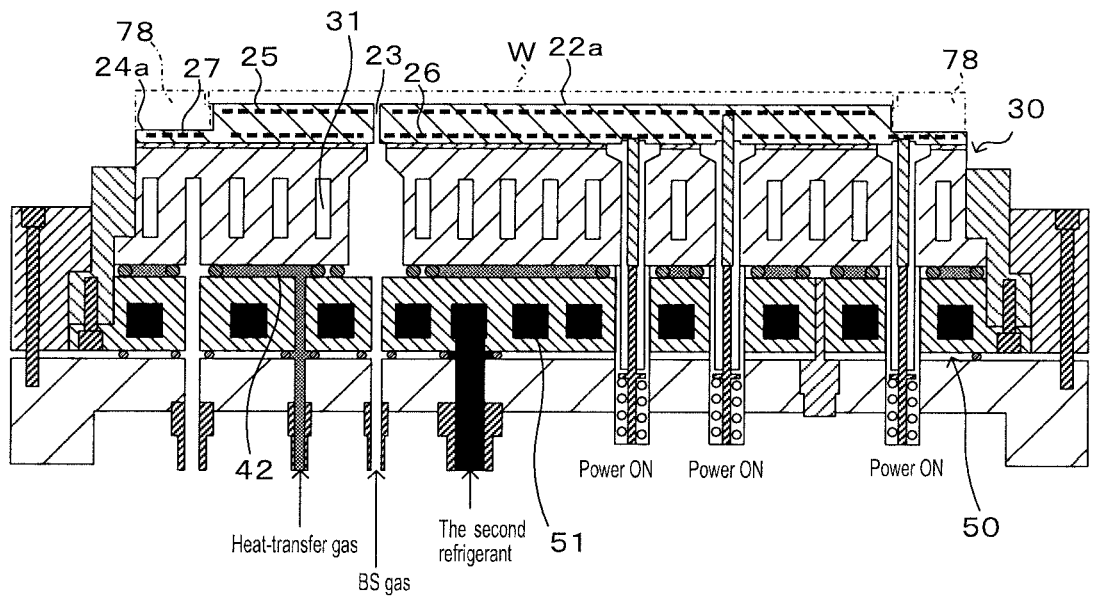
FIG. 5 is a view illustrating the wafer placement table 10 when a wafer W is processed at a high temperature.

In a process that requires an increase in the temperature of a wafer W in this way, as shown in FIG. 5, the first refrigerant is not flowed through the first refrigerant flow channel 31 of the first cooling base 30, and the second refrigerant is flowed through the second refrigerant flow channel 51 of the second cooling base 50. In other words, the operation of the first refrigerant circulator 36 is stopped to stop circulating the first refrigerant through the first refrigerant flow channel 31, and the second refrigerant circulator 56 is operated to circulate the second refrigerant through the second refrigerant flow channel 51. The thermal conductivity of the space layer 42 is increased by supplying heat-transfer gas to the space layer 42. With this configuration, heat of the wafer W heated by energizing the heater electrode 26 is not so drawn by the first cooling base 30 close to the ceramic base 20 and is drawn by the second cooling base 50 far from the ceramic base 20. Therefore, it is possible to process the wafer W while maintaining the wafer W at a high temperature.

Figure 6:
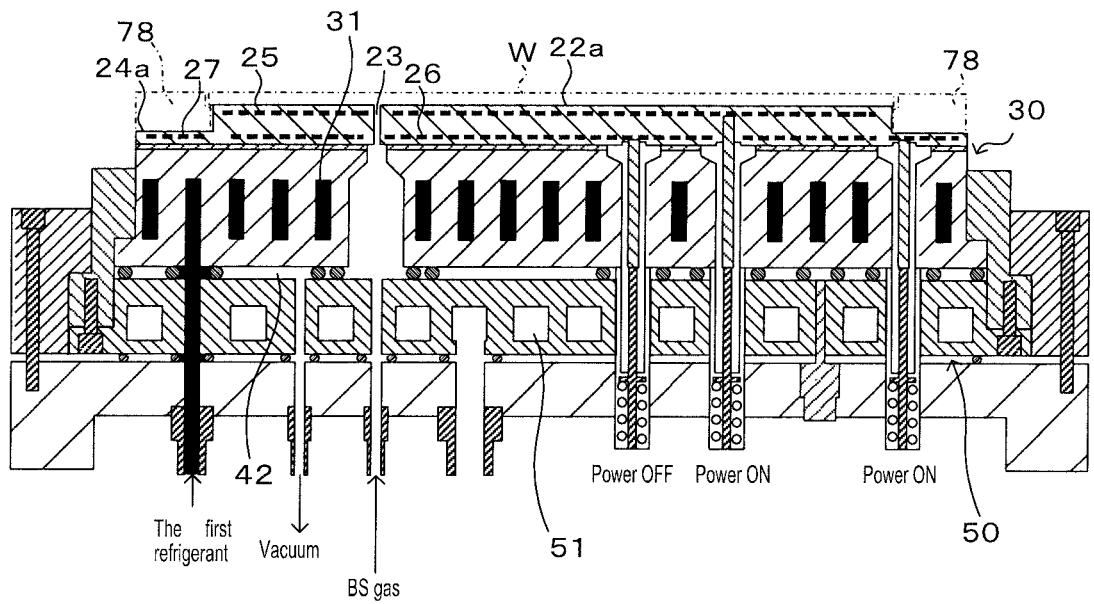
FIG. 6 is a view illustrating the wafer placement table 10 when heat is dissipated from the wafer W with high efficiency.

On the other hand, in a process that requires high heat dissipation of a wafer W, as shown in FIG. 6, energization of the heater electrode 26 is stopped, the wafer W is adsorbed to the wafer placement surface 22*a* by applying a direct current voltage to the wafer attracting electrode 25, and the focus ring 78 is adsorbed to the FR placement surface 24*a* by applying a direct current voltage to the FR attracting electrode 27. In addition, BS gas is supplied from the BS gas passage 23 to the back side of the wafer W. Then, the first refrigerant is flowed through the first refrigerant flow channel 31 of the first cooling base 30, and the second refrigerant is not flowed through the second refrigerant flow channel 51 of the second cooling base 50. In other words, the first refrigerant circulator 36 is operated to circulate the first refrigerant through the first refrigerant flow channel 31, and the operation of the second refrigerant circulator 56 is stopped to stop circulating the second refrigerant through the second refrigerant flow channel 51. In addition, heat transfer from the second cooling base 50 to the first cooling base 30 is suppressed by evacuating the space layer 42. With this configuration, heat of the high-temperature wafer W is drawn by the first cooling base 30 close to the ceramic base 20, so it is possible to efficiently dissipate heat from the wafer W. The temperature of the first refrigerant is preferably lower than the temperature of the second refrigerant. For example, the temperature of the first refrigerant may be set to −30° C., and the temperature of the second refrigerant may be set to 5° C.

As the wafer W is subjected to a plasma process, the focus ring 78 abrades; however, the focus ring 78 is thicker than the wafer W, replacement of the focus ring 78 is performed after processing a plurality of wafers W.

With the wafer placement table 10 according to the above-described embodiment, it is possible to achieve both processing a wafer W at a high temperature and efficiently dissipating heat from the wafer W.

The space layer 42 is capable of switching between a vacuum state and a heat-transfer gas filling state. Therefore, when the space layer 42 is set to the vacuum state, it is possible to insulate heat between the first cooling base 30 and the second cooling base 50. When the space layer 42 is filled with heat-transfer gas, it is possible to obtain good thermal conduction between the first cooling base 30 and the second cooling base 50.

Furthermore, the temperature of the first refrigerant is lower than the temperature of the second refrigerant. With this configuration, in a process that requires high heat dissipation of a wafer W, heat is more easily drawn by providing the first cooling base 30, so it is possible to further efficiently dissipate heat from the wafer W.

Yet furthermore, the first refrigerant flow channel 31 may be capable of switching between circulation and stop of circulation of the first refrigerant, and the second refrigerant flow channel 51 may be capable of switching between circulation and stop of circulation of the second refrigerant. Thus, in a process that requires high heat dissipation of a wafer W, the first refrigerant may be circulated through the first refrigerant flow channel 31, and, in a process of processing a wafer W at a high temperature, the second refrigerant may be circulated through the second refrigerant flow channel 51 while circulation of the first refrigerant through the first refrigerant flow channel 31 is stopped.

In addition, since the first and second cooling bases 30, 50 also function as plasma generating electrodes, it is possible to simplify the structure as compared to a case where a plasma generating electrode is embedded in the ceramic base 20.

Furthermore, since the difference in coefficient of thermal expansion in the range of 40° C. to 570° C. between the ceramic base 20 and the first cooling base 30 is lower than or equal to $1 \times 10^{-6}$/K, even when the wafer placement table 10 is repeatedly used at high and low temperatures, it is possible to reduce interference with bonding between the ceramic base 20 and the first cooling base 30. For example, when the ceramic base 20 is made of alumina, the first cooling base 30 is preferably made of SiSiCTi or AlSiC.

Yet furthermore, the thickness of the space layer 42 is preferably greater than or equal to 0.05 mm and less than or equal to 2 mm. When the thickness of the space layer 42 is greater than or equal to the lower limit value, it is possible to control variations in the thickness of the space layer in a plane, so it is preferable in terms of reducing the influence of thermal resistance variations. When the thickness of the space layer 42 is less than or equal to the upper limit value, it is preferable in terms of not large thermal resistance from the viewpoint of the response of temperature control. A spacer that restricts the thickness of the space layer 42 is preferably provided in the space layer 42. With this configuration, it is easy to maintain the overall thickness of the space layer 42.

In addition, the large-diameter seal ring 43 is preferably a combination of a metal ring and a resin ring (for example, the one of which the outer peripheral side is a metal ring and the inner peripheral side is a resin ring or the one of which the outer peripheral side is a resin ring and the inner peripheral side is a metal ring). With this configuration, the amount of deformation of the resin ring can be restricted by the metal ring. The first refrigerant flow channel 31 is preferably less in cross-sectional area and longer in flow channel length than the second refrigerant flow channel 51. With this configuration, good heat dissipation is obtained by the first refrigerant flow channel 31.

The present invention is not limited to the above-described embodiment and may be, of course, implemented in various modes within the technical scope of the present invention.

For example, in the above-described embodiment, the states of the first and second refrigerant flow channels 31, 51 and the state of the space layer 42 are set as shown in FIG. 5 when the wafer W is processed at a high temperature and is set as shown in FIG. 6 when heat is efficiently dissipated from the wafer W; however, the configuration is not limited thereto. For example, whether to circulate the first refrigerant through the first refrigerant flow channel 31 or whether to circulate the second refrigerant through the second refrigerant flow channel 51 may be set as needed depending on a situation. The temperature of the first refrigerant or the temperature of the second refrigerant may also be set as needed depending on a situation. Whether the space layer 42 is evacuated or filled with heat-transfer gas may also be set as needed depending on a situation.

In the above-described embodiment, the heater electrode 26 is wired all over the central part 22 when the central part 22 of the ceramic base 20 is viewed in plan. Alternatively, the central part 22 may be divided into a plurality of areas, and a heater electrode may be wired in each area. A single-pole electrode is adopted as each of the wafer attracting electrode 25 and the FR attracting electrode 27. Alternatively, a double-pole electrode may be adopted.

In the above-described embodiment, the through-holes of the first cooling base 30, through which the power supply terminals 62, 64, 66 are inserted, each may have an electrically insulating film on its inner wall or an electrically insulating tube through which a power supply terminal is inserted. Alternatively, electrical insulation may be ensured only by the distance between each of the power supply terminals 62, 64, 66 and the inner wall of the through-hole without including such an electrically insulating film or an electrically insulating tube.

In the above-described embodiment, the clamp member 70 and the mounting member 74 are annular members. Alternatively, the clamp member 70 and the mounting member 74 may be circular arc members obtained by dividing an annular member into a plurality of circular arcs.

In the above-described embodiment, a radio-frequency power supply is connected to the second cooling base 50. Alternatively, a radio-frequency power supply may be connected to the first cooling base 30. Two of a bias power supply for drawing ions and a source power supply for generating plasma may be connected to a wafer W as radio-frequency power supplies.

In the above-described embodiment, a ceramic mold is made by mold casting; however, the configuration is not limited thereto. For example, a ceramic mold may be made by laminating multiple sheets of tape mold. Alternatively, a ceramic sintered body 120 that incorporates the wafer attracting electrode 25, the heater electrode 26, and the FR attracting electrode 27 may be made by using first and third ceramic sintered bodies instead of the first and third ceramic molds 111, 113 of FIG. 3A, forming a ceramic powder layer between the first and third ceramic sintered bodies, and performing firing by hot pressing in this state.

In the above-described embodiment, the second cooling base 50 is connected to the radio-frequency power supply 87. Alternatively, the first cooling base 30 may be connected to the radio-frequency power supply 87.

In the above-described embodiment, the outer peripheral part 24 of the ceramic base 20 may incorporate a heater electrode.

The present application claims priority from Japanese Patent Application No. 2021-132887, filed on Aug. 17, 2021, the entire contents of which are incorporated herein by reference.

What is claimed is:

1. A wafer placement table comprising:
a ceramic base having a wafer placement surface and incorporating an electrostatic electrode and a heater electrode;
a first refrigerant source for supplying a first refrigerant;
a second refrigerant source for supplying a second refrigerant;
a first cooling base bonded via a metal bonding layer to a surface of the ceramic base on a side opposite to the wafer placement surface and having a first refrigerant flow channel capable of switching between supply and stop of supply of the first refrigerant; and
a second cooling base attached via a space layer, capable of supplying heat-transfer gas, to a surface of the first cooling base on a side opposite to the metal bonding layer and having a second refrigerant flow channel capable of switching between supply and stop of supply of the second refrigerant;
wherein the second refrigerant is a different refrigerant from the first refrigerant; and
wherein the second refrigerant flow channel is capable of switching between supply and stop of the second refrigerant independently of the supply and stop of the first refrigerant.

2. The wafer placement table according to claim 1, wherein
at least one of the first or second cooling bases also serves as a plasma generating electrode.

3. The wafer placement table according to claim 1, wherein
a difference in coefficient of thermal expansion between the ceramic base and the first cooling base is lower than or equal to $1 \times 10^{-6}$/K.

4. The wafer placement table according to claim 1, wherein
a thickness of the space layer is greater than or equal to 0.05 mm and less than or equal to 2 mm.

5. The wafer placement table according to claim 1, wherein
the space layer is defined by a seal ring disposed between the first cooling base and the second cooling base.

6. The wafer placement table according to claim 5, wherein
the seal ring is made of a combination of a metal ring and a resin ring.

7. The wafer placement table according to claim 6, wherein
a spacer that restricts a thickness of the space layer is provided in the space layer.

8. The wafer placement table according to claim 5, further comprising;
a spacer that restricts a thickness of the space layer is provided in the space layer.

9. The wafer placement table according to claim 1, wherein
the first refrigerant flow channel is less in cross-sectional area and longer in flow channel length than the second refrigerant flow channel.

10. The wafer placement table according to claim 1, wherein
the heat transfer gas is helium.

11. The wafer placement table according to claim 1, wherein
the space layer includes a space layer gas inlet passage and a space layer gas outlet passage.

12. The wafer placement table according to claim 11, further comprising a heat transfer gas supply source, a vacuum pump, and a selector valve connected to the space layer gas inlet passage and the space layer gas outlet passage.

* * * * *